(12) United States Patent
Ullmann

(10) Patent No.: US 7,429,856 B1
(45) Date of Patent: Sep. 30, 2008

(54) VOLTAGE SOURCE MEASUREMENT UNIT WITH MINIMIZED COMMON MODE ERRORS

(75) Inventor: Jens Ullmann, San Jose, CA (US)

(73) Assignee: Qualitau, Inc., Sunnyvale, CA (US)

( * ) Notice: Subject to any disclaimer, the term of this patent is extended or adjusted under 35 U.S.C. 154(b) by 0 days.

(21) Appl. No.: 11/942,964

(22) Filed: Nov. 20, 2007

(51) Int. Cl.
*G01R 1/30* (2006.01)
(52) U.S. Cl. .................................. 324/123 R
(58) Field of Classification Search ............ 324/769, 324/765, 158.1, 123 R, 763; 327/512, 52, 327/89, 96, 127, 246, 266, 274
See application file for complete search history.

(56) References Cited

U.S. PATENT DOCUMENTS

| | | | | |
|---|---|---|---|---|
| 5,608,329 A | * | 3/1997 | Imamura | ............ 324/537 |
| 6,160,404 A | * | 12/2000 | Schenk | ............ 324/464 |
| 6,763,697 B2 | * | 7/2004 | Bolz | ............ 73/23.2 |
| 7,098,648 B2 | | 8/2006 | Krieger et al. | |
| 7,154,291 B2 | * | 12/2006 | Turner | ............ 324/769 |

* cited by examiner

*Primary Examiner*—Jermele M. Hollington
*Assistant Examiner*—Tung X Nguyen
(74) *Attorney, Agent, or Firm*—Beyer Law Group LLP

(57) ABSTRACT

A particular configuration of voltage source measurement (VSM) circuitry minimizes common mode errors in measurement of current through a device under test (DUT), even across a wide range of output voltages. The current $I_{DUT}$ is not affected by common-mode errors, since the current measurement is based on the output voltage of an operational amplifier or a differential amplifier, and the circuit configuration is such that the current measurement is made while the operation amplifier or differential amplifier has very low common-mode input voltage.

14 Claims, 2 Drawing Sheets

VOLTAGE SOURCE MEASUREMENT UNIT WITH MINIMIZED COMMON MODE ERRORS

BACKGROUND

The current invention is in the field of voltage sense measurement (VSM) circuitry.

Measuring electric current ("current") accurately is an important use of parametric testers, in particular those used for semiconductor device characterization. When high-quality Voltage Sources Measurement Units (VSMUs) are considered for use with a device-under-test (DUT), a commonly used current measurement methodology is to sense the resulting voltage drop across a precision resistor (Rnet) connected in series with the "high" end of the DUT. An example of this is disclosed in U.S. Pat. No. 7,098,648. This methodology, while simple and topologically convenient, has potential disadvantages in that the common-mode voltage across Rnet varies with output (DUT) voltage, leading to a variable offset error.

Offset errors can be significant. For example, a high quality differential amplifier may have common mode gain of 1/20,000, meaning that at output voltage (Vout) of 10 V, the offset voltage increases by 10/20,000 V, or 500 µV, relative to the offset at Vout=0 V. If the measured voltage drop across Rnet is 10 mV only (low current range, for example), the resulting relative error is 5%—which can be unacceptably high for such systems. Furthermore, for example, if Vout is 100 V, a similar current will be measured with an error of 50%.

The invention addresses this issue for a two-terminal device, primarily when the DUT is placed in close proximity to the force lines. Furthermore, the solution has additional benefits compared to conventional VSM circuitry.

SUMMARY

A particular configuration of voltage source measurement (VSM) circuitry minimizes common mode errors in measurement of current through a device under test (DUT), even across a wide range of output voltages. The current IDUT is not affected by common-mode errors, since the current measurement is based on the output voltage of an operational amplifier or a differential amplifier, and the circuit configuration is such that the current measurement is made while the operation amplifier or differential amplifier has very low common-mode input voltage.

DETAILED DESCRIPTION

Figure 1:
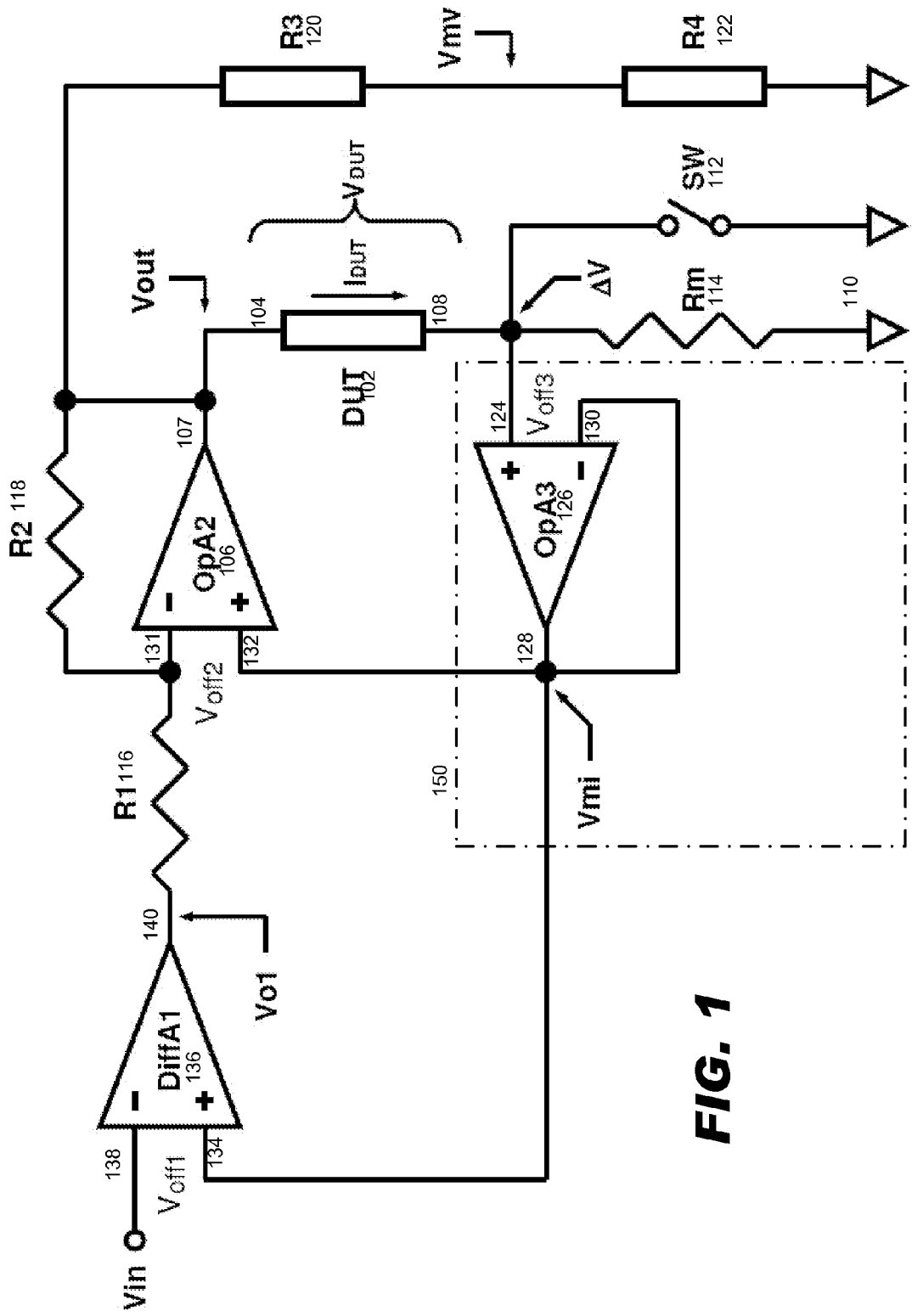
FIG. 1 schematically illustrates a particular configuration of voltage source measurement (VSM) circuitry in which common mode errors are minimized.

The inventor has realized that a particular configuration of voltage source measurement (VSM) circuitry can minimize common mode errors, even across a wide range of output voltages. An example of such a configuration is schematically illustrated in FIG. 1 which, in operation, minimizes common mode errors. As such, this is an attractive configuration for VSM circuitry where a wide range of operating voltages is utilized.

Turning to FIG. 1, in operation, the DUT 102 "high" terminal 104 is driven by the output of an operational amplifier OpA2 106, and the current from the "low" terminal 108 of the DUT 102 is sunk directly to the common ("ground") 110 during a stress mode of operation, with switch SW 112 closed, and via precision resistor Rm 114 during a measurement mode of operation.

Resistors R1 116 and R2 118 set the gain for OA2 106, while precision resistors R3 120 and R4 122 form a voltage measurement network.

The non-inverting input 124 of an operational amplifier OpA3 126 is coupled to the "low" terminal 108 of the DUT 102, and the output 128 of the operational amplifier OpA3 126 is coupled to the inverting input 130 of the operational amplifier OpA3 126, as well as to the non-inverting input 132 of the operational amplifier OpA2 106 and to a non-inverting input 134 of the differential amplifier DiffA1 136.

Vin is a precision set voltage, provided to the inverting input 138 of the differential amplifier DiffA1 136. Vmi, the voltage level provided to the non-inverting input 134 of the differential amplifier DiffA1 136 is proportional to the DUT 102 current. The relationship between these voltage level magnitudes may be represented through the following derivation, where Vo1 is the voltage level at the output 140 of differential amplifier DiffA1 136 and ΔV is the voltage level at the low terminal 108 of the DUT 102:

$$V_{o1} = \Delta V - V_{off3} - V_{off1} - V_{in} \quad (1)$$

The offset voltages Voff1, Voff2, and Voff3 are measured from the respective inverting to respective non-inverting inputs of the operational amplifiers.

$$V_{out} = V_{o1} + \frac{\Delta V - V_{off3} - V_{off2} - V_{o1}}{R1}(R1 + R2) \quad (2)$$

Substituting (1) into (2) and rearranging terms:

$$V_{out} = Vin\left(\frac{R2}{R1}\right) + \Delta V \pm |V_{err}| \quad (3)$$

$$V_{DUT} = Vin\left(\frac{R2}{R1}\right) \pm |V_{err}| \quad (4)$$

$$I_{DUT} = \frac{\Delta V}{Rm} = \frac{(V_{mi} + V_{off3})}{Rm} \quad (5)$$

Where, $$|V_{err}| \leq 2|V_{off\,max}|\left(1 + \frac{R2}{R1}\right) \quad (6)$$

An advantage of the VSM circuitry schematically illustrated in FIG. 1 can be seen from equation (5): That is, the current $I_{DUT}$ is not affected by common-mode errors since Vmi is measured while OpA3 126 has very low common-mode input voltage (ΔV is kept low by design). Voff3, similar to Voff1 and Voff2, may be very low (e.g., <1.0 mV) by judicious selection of the operational amplifiers. Furthermore, the offset error can be reduced almost to zero by subtracting the value of Vmi when SW 112 is closed ($I_{DUT}$ flows via SW 112) from a value of Vmi acquired when SW 112 is open ($I_{DUT}$ flows via Rm 114).

In an alternate example, the portion 150 of the FIG. 1 circuit is modified. In the modified portion, the operational amplifier OpA3 126 is not present but, rather, a high quality differential amplifier (such as like the differential amplifier DiffA1 136) is provided such that, in operation, a single measurement of Vmi may be acquired, rather than two consecutive measurements (with switch SW 112 open and closed) and subsequent subtraction as described above. As a result of operating by acquiring one measurement rather than two measurements, thermal noise error can be reduced by 50%.

Figure 2:
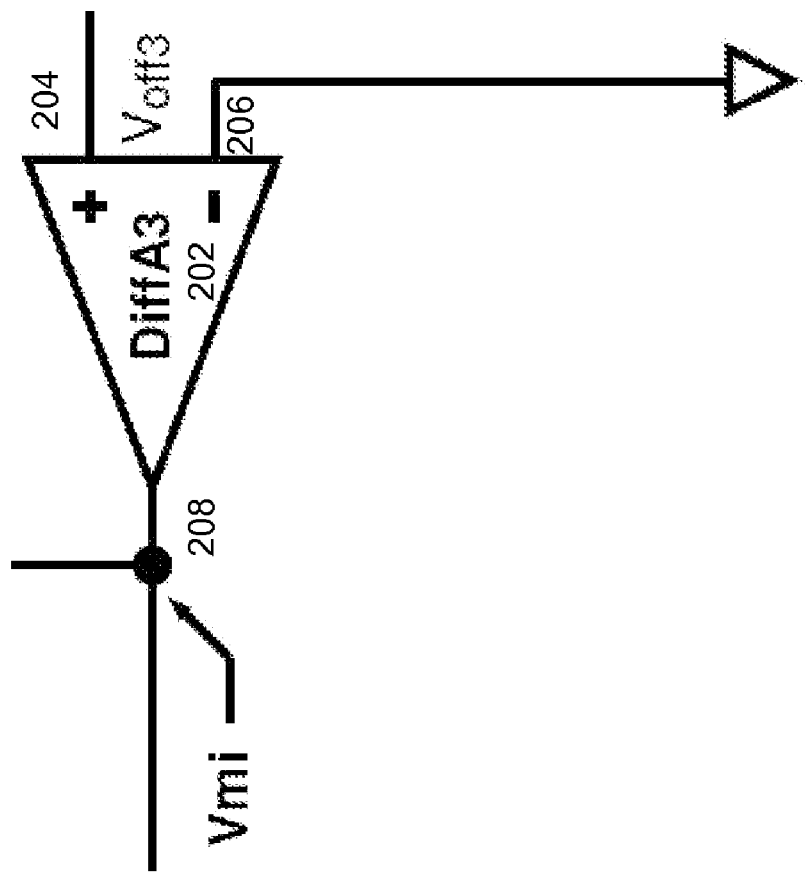
FIG. 2 schematically illustrates an alternate configuration of the FIG. 1 configuration.

FIG. 2 schematically illustrates, in accordance with the alternate example, the portion 150 of the FIG. 1 circuit as modified, including differential amplifier DiffA3 202 in place of operational amplifier OpA3 126 of the FIG. 1 circuit. It is noted that, even with the configuration of the FIG. 2 alternate example (including the differential amplifier DiffA3 202), there may be some offset and, so, it may be desirable to make a voltage output measurement of the differential amplifier DiffA3 202 at zero voltage (i.e., with the switch SW 112 closed) in order to measure the offset and compensate for it in the value of Vmi when calculating $I_{DUT}$ using equation (5) above.

Furthermore, multi-gain capability can be fairly easily implemented. Multi-gain capability can be useful, since voltage output of many high precision digital to analog converters (DACs) can be limited to |2.0 V| (i.e. $|Vin| \leq 2.0$ V). To achieve |Vmax|=10V, for example, a gain of 5 would be used, while a 100 V capability would use a gain of 50. To keep voltage resolution high for all ranges, multi-gain capability is useful.

To attain such capability, the VSM circuitry can utilize a different ratio R2/R1, with no common-mode error in measuring the related current. For example, keeping R1=R2 results in unity gain and DUT voltage $V_{DUT}$=Vin (i.e., limited to Vin (max) or to approximately +/−2.0 V). As another example, when R2=50R1, $V_{DUT}$=50Vin. Note that offset errors are also increased with gain, as the worst case offset error |Verr| increases from 4|Voff(max)| for unity gain, to about 200|Voff(max)| for a gain of 50 (referring to equation (6) above). However, while these offset errors generally should not be ignored, the fact that the offset errors are mainly affected by temperature makes it relatively easy to almost eliminate them by initial measurement at Vin=0 for $V_{DUT}$, and when SW is on (short to ground) for $I_{DUT}$.

Another advantage of the VSM circuitry is the small number of components connected to potentially high-voltage nodes (R1 116, R2 118, OpA2 106). In particular, two of the three active components, DiffA1 136 and OpA3 126, operate under low voltage. This can be significant, since high supply voltage and high performance (i.e. low offset voltage and low noise) is generally not easily attainable together in active integrated circuits.

Also, having no sensitive measurement near the output of Opa2 106 ("high" node 104 of DUT 102) means there may be no need for special protection against leakage due to high common mode voltage at the measurement circuitry. In contrast, since the voltage at point ΔV (low node 108 of DUT 102) is kept low by design, even a long the line between Rm and the non-inverting input 124 of OpA3 126 (the current measurement circuitry) will have little or no effect on $V_{DUT}$. Furthermore, even if a small portion of $I_{DUT}$ leaks to ground along this line before flowing into Rm, its only effect will be similar to a change in Voff3—a change that can be fully accounted for or eliminated.

Finally, if voltage verification or monitoring is desired, a simple attenuator [R4/(R3+R4)] (i.e., using resistors R3 120 and R4 122) may be easily used (FIG. 1), with no effect on $I_{DUT}$ and its measurement accuracy.

What is claimed is:

1. Voltage source measurement unit (VSMU) circuitry configured to measure current across a device under test (DUT 202), the DUT having a first terminal (high terminal 104) and a second terminal (low terminal 108), the VSMU circuitry comprising:
   a precision resistor Rm 114; and
   a first operational amplifier (OpA2 106) configured with an output (107) to drive the high terminal 104 of the DUT 102;
   wherein the VSMU circuitry is configurable to cause current to be sunk from the low terminal 108 of the DUT 102 to a common sink via the precision resistor (Rm 114);
the VSMU circuitry further comprising:
   a second operational amplifier (OpA3 126) having a non-inverting input (124) configured to be connected to the low terminal (108) of the DUT (102), having an inverting input (130) configured to be connected to an output (128) of the second operational amplifier (OpA3 126) and to a non-inverting input (132) of the first operational amplifier (OpA2 106); and
   a differential amplifier (DiffA1 136) having a non-inverting input (134) connected to the output 128 of the second operational amplifier (OpA3 126), an inverting input (138) connected to receive a precision set voltage (Vin), and an output coupled to an inverting input (131) of the first operational amplifier (OpA2 106).

2. The VSMU circuitry of claim 1, wherein:
the VSMU circuitry is configured to selectably switch the non-inerting terminal (124) of the second operational amplifier (OpA3 126) to be directly connected to the common sink and not via the precision resistor (Rm 114).

3. The VSMU circuitry of claim 1, further comprising:
attenuation circuitry connected between the output of the first operational amplifier and the common sink.

4. A method of measuring current through a device under test (DUT 102), comprising:
connecting the DUT to voltage sense measurement unit (VSMU) circuitry, the DUT having a first terminal (high terminal 104) and a second terminal (low terminal 108), the VSMU circuitry comprising:
   a precision resistor Rm 114;
   a first operational amplifier (OpA2 106) configured with an output (107) to drive the high terminal 104 of the DUT 102;
   wherein the VSMU circuitry is further configurable to cause current to be sunk from the low terminal 108 of the DUT 102 to a common sink via the precision resistor (Rm 114);
   the VSMU circuitry further comprising:
   a second operational amplifier (OpA3 126) having a non-inverting input (124) connected to the low terminal (108) of the DUT (102), having an inverting input (130) configured to be connected to an output (128) of the second operational amplifier (OpA3 126) and to a non-inverting input (132) of the first operational amplifier (OpA2 106);
   a differential amplifier (DiffA1 136) having a non-inverting input (134) connected to the output 128 of the second operational amplifier (OpA3 126), an inverting input (138) connected to receive a precision set voltage (Vin), and an output coupled to an inverting input (131) of the first operational amplifier (OpA2 106);

the method further comprising:
taking a first voltage measurement at the output (128) of the second operational amplifier (OpA3 126); and
processing the first voltage measurement to determine the current across the DUT.

5. The method of claim 4, wherein:
the first voltage measurement is Vmi, the value of the precision resistor (Rm 114) is Rm, and an offset voltage between the non-inverting terminal (124) of the second operational amplifier (OpA3 126) and the inverting terminal (130) of the second operational amplifier (OpA3 126) is Voff3; and
processing the first voltage measurement to determine the current $I_{DUT}$ across the DUT is consistent with the equation:

$$I_{DUT} = \frac{(V_{mi} + V_{off3})}{Rm}.$$

6. The method of claim 4, further comprising:
taking a second voltage measurement at the output (128) of the second operational amplifier (OpA3 126) with the non-inverting terminal 124 of the second operational amplifier (OpA3 126) selected to be directly connected to the common sink and not via the precision resistor (Rm 114),
wherein the step of processing the first measurement to determine the current across the DUT includes also processing the second measurement to determine the current across the DUT.

7. The method of claim 6, wherein:
processing the first voltage measurement and the second voltage measurement to determine the current through the DUT comprises subtracting the second voltage measurement from the first voltage measurement to determine a voltage Vmi;
the value of the precision resistor (Rm 114) is Rm, and an offset voltage between the non-inverting terminal (124) of the second operational amplifier (OpA3 126) and the inverting terminal (130) of the second operational amplifier (OpA3 126) is Voff3; and
processing the first voltage measurement to determine the current $I_{DUT}$ across the DUT is consistent with the equation:

$$I_{DUT} = \frac{(V_{mi} + V_{off3})}{Rm}.$$

8. A voltage source measurement unit (VSMU) configured to measure current through a device under test (DUT 202), the DUT having a first terminal (high terminal 104) and a second terminal (low terminal 108), the VSMU comprising:
a precision resistor Rm 114;
a first operational amplifier (OpA2 106) configured with an output (107) to drive the high terminal 104 of the DUT 102;
wherein the VSMU is further configurable to cause current to be sunk from the low terminal 108 of the DUT 102 to a common sink via the precision resistor (Rm 114);

the VSMU further comprising:
a first differential amplifier (DiffAmp3 202) having a non-inverting input (204) configured to be connected to the low terminal (108) of the DUT (102), having an inverting input (130) connected to the common sink, and an output (208) connected to a non-inverting input (132) of the first operational amplifier (OpA2 106);
a second differential amplifier (DiffA1 136) having a non-inverting input (134) connected to the output 128 of the second operational amplifier (OpA3 126), an inverting input (138) connected to receive a precision set voltage (Vin), and an output coupled to an inverting input (131) of the first operational amplifier (OpA2 106).

9. The VSMU circuitry of claim 8, wherein:
the VSMU circuitry is configured to selectably switch the non-inverting input (204) of the first differential amplifier (DiffAmp3 202) to be directly connected to the common sink and not via the precision resistor (Rm 114).

10. The VSMU circuitry of claim 8, further comprising:
attenuation circuitry connected between the output of the first operational amplifier and the common sink.

11. A method of measuring current through a device under test (DUT 102), comprising:
connecting the DUT to voltage sense measurement unit (VSMU) circuitry, the DUT having a first terminal (high terminal 104) and a second terminal (low terminal 108), the VSMU circuitry comprising:
a precision resistor Rm 114;
a first operational amplifier (OpA2 106) configured with an output (107) to drive the high terminal 104 of the DUT 102;
wherein the VSMU is further configurable to cause current to be sunk from the low terminal 108 of the DUT 102 to a common sink via the precision resistor (Rm 114);
the VSMU further comprising:
a first differential amplifier (DiffAmp3 202) having a non-inverting input (204) connected to the low terminal (108) of the DUT (102), having an inverting input (206) connected to the common sink, and an output (208) connected to a non-inverting input (132) of the first operational amplifier (OpA2 106);
a second differential amplifier (DiffA1 136) having a non-inverting input (134) connected to the output 128 of the second operational amplifier (OpA3 126), an inverting input (138) connected to receive a precision set voltage (Vin), and an output coupled to an inverting input (131) of the first operational amplifier (OpA2 106); and the method further comprising:
taking a first voltage measurement at the output (208) of the first differential amplifier (DiffA3 202); and
processing the first voltage measurement to determine the current across the DUT.

12. The method of claim 11, wherein:
the first voltage measurement is Vmi, the value of the precision resistor (Rm 114) is Rm, and an offset voltage between the non-inverting terminal (204) of the first differential amplifier (DiffA3 202) and the inverting terminal (206) of the first differential amplifier (DiffA3 202) is $V_{off3}$; and
processing the first voltage measurement to determine the current $I_{DUT}$ across the DUT is consistent with the equation:

$$I_{DUT} = \frac{(V_{mi} + V_{off3})}{Rm}.$$

13. The method of claim 11, further comprising:

taking a second voltage measurement at the output (128) of the first differential amplifier (DiffA3 202) with the non-inverting terminal 124 of the first differential amplifier (DiffA3 126) selected to be directly connected to the common sink and not via the precision resistor (Rm 114), wherein the step of processing the first measurement to determine the current across the DUT includes also processing the second measurement to determine the current across the DUT.

14. The method of claim 13, wherein:

processing the first voltage measurement and the second voltage measurement to determine the current through the DUT comprises subtracting the second voltage measurement from the first voltage measurement to determine a voltage Vmi;

the value of the precision resistor (Rm 114) is Rm, and an offset voltage between the non-inverting terminal (204) of the first differential amplifier (DiffA3 202) and the inverting terminal (206) of the first differential amplifier (DiffA3 202) is $V_{off3}$; and processing the first voltage measurement to determine the current $I_{DUT}$ across the DUT is consistent with the equation:

$$I_{DUT} = \frac{(V_{mi} + V_{off3})}{Rm}.$$

* * * * *

UNITED STATES PATENT AND TRADEMARK OFFICE
CERTIFICATE OF CORRECTION

PATENT NO. : 7,429,856 B1 Page 1 of 1
APPLICATION NO. : 11/942964
DATED : September 30, 2008
INVENTOR(S) : Jens Ullmann It is certified that error appears in the above-identified patent and that said Letters Patent is hereby corrected as shown below:

Col. 4, line 7 (Claim 1), change "202" to --102--.

Col. 5, line 58 (Claim 8), change "202" to --102--.

Signed and Sealed this

Thirteenth Day of July, 2010

David J. Kappos
*Director of the United States Patent and Trademark Office*